US011563192B2

(12) United States Patent
Wei et al.

(10) Patent No.: US 11,563,192 B2
(45) Date of Patent: Jan. 24, 2023

(54) DISPLAY DEVICE HAVING SOME EDGES OF COVER PLATE THAT DO NOT OVERLAP WITH THE UNDERLYING ARRAY SUBSTRATE AND METHOD FOR MANUFACTURING THE SAME

(71) Applicant: BOE TECHNOLOGY GROUP CO., LTD., Beijing (CN)

(72) Inventors: Junbo Wei, Beijing (CN); Shengji Yang, Beijing (CN); Chao Pu, Beijing (CN); Kuanta Huang, Beijing (CN); Pengcheng Lu, Beijing (CN); Xiaochuan Chen, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 113 days.

(21) Appl. No.: 16/959,322

(22) PCT Filed: Aug. 16, 2019

(86) PCT No.: PCT/CN2019/100995
§ 371 (c)(1),
(2) Date: Jun. 30, 2020

(87) PCT Pub. No.: WO2021/030938
PCT Pub. Date: Feb. 25, 2021

(65) Prior Publication Data
US 2021/0408432 A1 Dec. 30, 2021

(51) Int. Cl.
*H01L 51/52* (2006.01)
*H01L 27/32* (2006.01)
(Continued)

(52) U.S. Cl.
CPC ........ *H01L 51/524* (2013.01); *H01L 27/3244* (2013.01); *H01L 51/0024* (2013.01);
(Continued)

(58) Field of Classification Search
None
See application file for complete search history.

(56) References Cited

U.S. PATENT DOCUMENTS

2011/0169791 A1* 7/2011 Hida ..................... G02F 1/1345
345/204
2016/0132148 A1* 5/2016 Han ..................... G06F 3/0443
345/174
(Continued)

FOREIGN PATENT DOCUMENTS

CN 107393422 A 11/2017
CN 108957880 A 12/2018
(Continued)

*Primary Examiner* — Michael Jung
(74) *Attorney, Agent, or Firm* — Scully Scott Murphy & Presser

(57) ABSTRACT

A display device and a method for manufacturing a display device are provided. The display device includes an array substrate and a cover plate. The array substrate is a silicon-based organic light-emitting diode array substrate. An orthographic projection of the array substrate in a plane parallel to the array substrate covers an orthographic projection of the cover plate in the plane, the orthographic projection of the array substrate includes a plurality of edges, the orthographic projection of the cover plate includes a plurality of edges, the plurality of edges of the array substrate are in one-to-one correspondence to the plurality of edges of the cover plate. At least two edges of the orthographic projection of the array substrate do not overlap with corresponding edges of the orthographic projection of the cover plate and are located outside the orthographic projection of the cover plate.

20 Claims, 10 Drawing Sheets

(51) Int. Cl.
    *H01L 51/56*     (2006.01)
    *H01L 51/00*     (2006.01)
    *G09G 3/3258*    (2016.01)
(52) U.S. Cl.
    CPC .......... *H01L 51/0096* (2013.01); *H01L 51/56* (2013.01); *G09G 3/3258* (2013.01); *G09G 2300/0452* (2013.01); *G09G 2300/0819* (2013.01); *G09G 2300/0842* (2013.01); *G09G 2320/0257* (2013.01); *H01L 2227/323* (2013.01)

(56) References Cited

U.S. PATENT DOCUMENTS

| | | | |
|---|---|---|---|
| 2017/0192266 A1* | 7/2017 | Li | G02F 1/133351 |
| 2018/0088387 A1* | 3/2018 | Enami | G02F 1/13458 |
| 2018/0108783 A1* | 4/2018 | Meng | H01L 29/41733 |
| 2018/0182984 A1 | 6/2018 | Lim et al. | |
| 2018/0375062 A1* | 12/2018 | Ide | H01L 51/5246 |

FOREIGN PATENT DOCUMENTS

| | | |
|---|---|---|
| CN | 109061957 A | 12/2018 |
| CN | 208521099 U | 2/2019 |
| CN | 208861113 U | 5/2019 |

\* cited by examiner

DISPLAY DEVICE HAVING SOME EDGES OF COVER PLATE THAT DO NOT OVERLAP WITH THE UNDERLYING ARRAY SUBSTRATE AND METHOD FOR MANUFACTURING THE SAME

CROSS-REFERENCE TO RELATED APPLICATIONS

This application is a national phase entry of PCT International Application No. PCT/CN2019/100995, filed on Aug. 16, 2019. The disclosure of PCT International Application No. PCT/CN2019/100995 is incorporated by reference herein.

TECHNICAL FIELD

Embodiments of the present disclosure relate to a display device and a method for manufacturing a display device.

BACKGROUND

With the development of technologies, organic light-emitting diode (OLED) display devices have gradually attracted widespread attention due to advantages of wide viewing angle, high contrast ratio, fast response speed, higher luminous brightness and lower driving voltage compared with inorganic light-emitting display devices. Due to the above characteristics, OLEDs can be applied to devices with display functions, such as mobile phones, displays, notebook computers, digital cameras, instruments, and meters.

SUMMARY

At least one embodiment of the present disclosure provides a display device, and the display device comprises an array substrate and a cover plate that is opposite to the array substrate, the array substrate is a silicon-based organic light-emitting diode array substrate, the cover plate comprises a plurality of edges. At positions of at least two edges of the cover plate, an orthographic projection of the array substrate in a plane parallel to the array substrate extends outside an orthographic projection of the cover plate in the plane.

For example, in the display device provided by at least one embodiment of the present disclosure, the cover plate comprises four edges, and at positions of the four edges of the cover plate, the orthographic projection of the array substrate in the plane extends outside the orthographic projection of the cover plate in the plane.

For example, in the display device provided by at least one embodiment of the present disclosure, the array substrate comprises a plurality of edges, the plurality of edges of the cover plate are in one-to-one correspondence to the plurality of edges of the array substrate, and the edges of the cover plate are parallel to the edges, that are corresponding to the edges of the cover plate, of the array substrate, respectively.

For example, in the display device provided by at least one embodiment of the present disclosure, a shape of the array substrate and a shape of the cover plate are rectangles, squares, or hexagons.

For example, in the display device provided by at least one embodiment of the present disclosure, the array substrate comprises a first bonding region, and an orthographic projection of the first bonding region in the plane does not overlap with the orthographic projection of the cover plate in the plane.

For example, the display device provided by at least one embodiment of the present disclosure further comprises a flexible printed circuit board, the array substrate comprises a gate driving circuit, a data driving circuit, and a plurality of pixel units, and the plurality of pixel units comprise cathodes; and the flexible printed circuit board is electrically connected to the first bonding region and is configured to transmit electrical signals to the gate driving circuit, the data driving circuit, and the cathodes of the plurality of pixel units, respectively.

For example, the display device provided by at least one embodiment of the present disclosure further comprises a hard printed circuit board, the hard printed circuit board comprises a second bonding region, the array substrate is on the hard printed circuit board, and an orthographic projection of the second bonding region in the plane parallel to the array substrate does not overlap with the array substrate; and the first bonding region is electrically connected to the second bonding region through a conductive member.

For example, in the display device provided by at least one embodiment of the present disclosure, a material of the cover plate comprises glass.

For example, the display device provided by at least one embodiment of the present disclosure further comprises a display region, and an orthographic projection of the display region in the plane is within the orthographic projection of the cover plate in the plane.

For example, in the display device provided by at least one embodiment of the present disclosure, the array substrate comprises a silicon substrate and an anode layer, an organic light-emitting layer, a cathode layer, a first thin film encapsulation layer, and a color film layer that are sequentially laminated on the silicon substrate; and an orthographic projection of the anode layer, an orthographic projection of the organic light-emitting layer, an orthographic projection of the cathode layer, an orthographic projection of the first thin film encapsulation layer, and an orthographic projection of the color film layer in the plane are all within the orthographic projection of the cover plate in the plane.

For example, in the display device provided by at least one embodiment of the present disclosure, the anode layer, the organic light-emitting layer, the cathode layer, the first thin film encapsulation layer, and the color film layer are at least in the display region.

For example, in the display device provided by at least one embodiment of the present disclosure, the array substrate further comprises a second thin film encapsulation layer, the second thin film encapsulation layer is on the color film layer, and the cover plate is on the second thin film encapsulation layer.

For example, in the display device provided by at least one embodiment of the present disclosure, an orthographic projection of the second thin film encapsulation layer in the plane is within the orthographic projection of the cover plate in the plane.

For example, in the display device provided by at least one embodiment of the present disclosure, among edges of the cover plate and the array substrate that are corresponding to each other and not equal in length, a difference in length between at least one edge of the cover plate and a corresponding edge of the array substrate ranges from about −3 mm to −0.5 mm.

For example, in the display device provided by at least one embodiment of the present disclosure, the display region comprises a plurality of edges, the plurality of edges of the cover plate are in one-to-one correspondence to the plurality of edges of the display region, and the edges of the cover plate are parallel to the edges, that are corresponding to the edges of the cover plate, of the display region, respectively; and among edges of the display region and the cover plate that are corresponding to each other and not equal in length, a difference in length between at least one edge of the display region and a corresponding edge of the cover plate ranges from about −2 mm to −0.1 mm.

At least one embodiment of the present disclosure also provides a method for manufacturing a display device, and the method comprises: providing an array substrate motherboard, in which the array substrate motherboard a silicon-based organic light-emitting diode array substrate motherboard and comprises a plurality of array substrate regions; bonding a plurality of cover plates with the plurality of array substrate regions of the array substrate motherboard, respectively, in which each of the plurality of cover plates comprises a plurality of edges, and for an array substrate region and a cover plate which are correspondingly bonded, at positions of at least two edges of the cover plate, an orthographic projection of the array substrate region in a plane parallel to the array substrate motherboard extends outside an orthographic projection of the cover plate in the plane; and cutting the array substrate motherboard bonded with the plurality of cover plates to separate the plurality of array substrate regions.

For example, in the method provided by at least one embodiment of the present disclosure, an amount of the plurality of cover plates is equal to an amount of the plurality of array substrate regions.

For example, in the method provided by at least one embodiment of the present disclosure, for the array substrate region and the cover plate which are correspondingly bonded, at positions of all edges of the cover plate, the orthographic projection of the array substrate region in the plane parallel to the array substrate motherboard extends outside the orthographic projection of the cover plate in the plane.

BRIEF DESCRIPTION OF THE DRAWINGS

In order to clearly illustrate the technical solutions of the embodiments of the present disclosure, the drawings of the embodiments will be briefly described in the following; and it is obvious that the described drawings are only related to some embodiments of the present disclosure and thus are not limitative to the present disclosure.

FIG. 2B is a schematic projection diagram of the display device illustrated in

FIG. 2A;

DETAILED DESCRIPTION

Figure 1A:
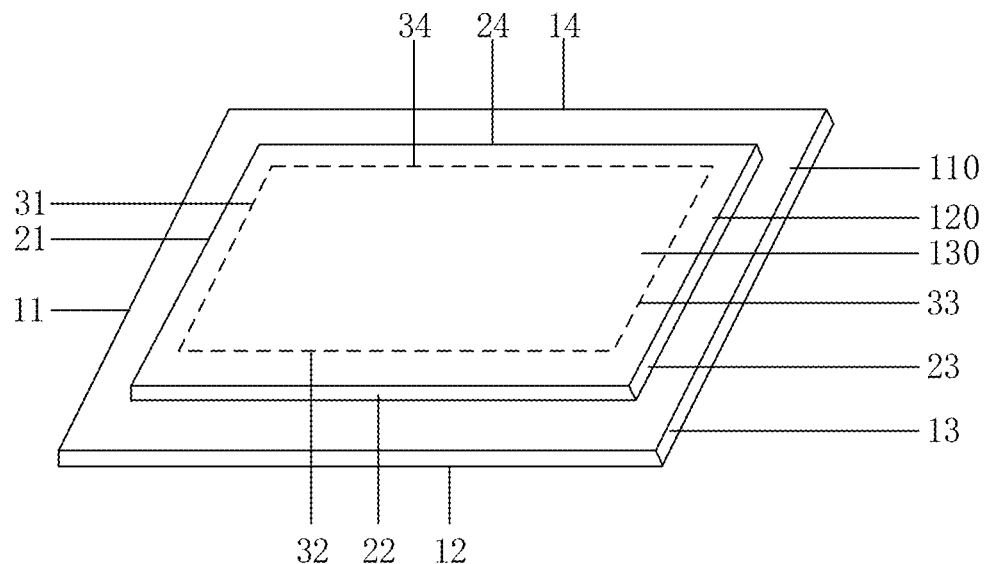
FIG. 1A is a schematic diagram of a display device provided by some embodiments of the present disclosure.

In order to make objects, technical details and advantages of the embodiments of the present disclosure apparent, the technical solutions of the embodiments will be described in a clearly and fully understandable way in connection with the drawings related to the embodiments of the present disclosure. Apparently, the described embodiments are just a part but not all of the embodiments of the present disclosure. Based on the described embodiments herein, those skilled in the art can obtain other embodiment(s), without any inventive work, which should be within the scope of the present disclosure.

Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount or importance, but distinguish various components. The terms "comprise," "comprising," "comprise," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may comprise an electrical connection, directly or indirectly. "On," "under," "right," "left" and the like are only used to indicate relative position relationship, and when the position of the object which is described is changed, the relative position relationship may be changed accordingly. In order to keep the following description of embodiments of the present disclosure clear and concise, the present disclosure omits detailed descriptions of some known functions and known components.

Micro-OLED is a new type of OLED display device in which a silicon substrate serves as a base substrate. The silicon-based OLED has characteristics of small volume, high resolution, and the like, can be manufactured by a mature complementary metal oxide semiconductor (CMOS) process of an integrated circuit, realizes active addressing of pixels, has a timer control register (TCON) circuit, over current protection (OCP) circuit, and other circuits, can realize light weight, and are widely used in fields of near-eye display, virtual reality (VR), and augmented reality (AR), especially in AR/VR head-mounted display devices. In the case where the OLED display device is applied in the near-eye display equipment, the fixed position of the display device is very important to the user, which determines the user's experience.

The common silicon-based OLED display device (or display panel) adopts a design that the glass cover plate is aligned with the array substrate, that is, the size of the glass cover plate and the size of the array substrate are the same or almost the same, and edges of the glass cover plate are aligned with edges of the array substrate, which leads to a series of problems. On the one hand, in the case where the silicon-based OLED display device is applied to the AR/VR device, the positioning is performed through the glass cover plate. Operations of fixing and locking the display device may cause extrusion to the glass cover plate, which is easy to break the glass cover plate. On the other hand, in the manufacturing process of the silicon-based OLED display device, an array substrate motherboard needs to be cut into small display panels after bonding with the glass cover plates. In the case where the glass cover plate is designed to be aligned with the array substrate, the glass cover plate may be cut twice, which not only is easy to damage the cutting machine (e.g., easy to damage the cutter wheel), but also causes a structural outer contour of the display panel to be uneven and causes problems, such as edge collapse and the like.

At least one embodiment of the present disclosure provides a display device and a method for manufacturing a display device. The display device can lower the risk of breakage of the glass cover plate, facilitate positioning, fixing and locking, prevent the glass cover plate from being cut twice, thereby avoiding damage to the cutting machine, solving the problems of uneven edges, edge collapse, etc., of the glass cover plate, contributing to improving the bonding precision and connection strength of the glass cover plate, improving the bonding effect, improving the capability of matching other structures and the mechanical strength of the display device, and prolonging the service life of the display device.

Hereinafter, embodiments of the present disclosure will be described in detail with reference to the accompanying drawings. It should be noted that the same reference numerals in different drawings are used to refer to the same elements already described.

At least one embodiment of the present disclosure provides a display device, which comprises an array substrate and a cover plate which is opposite to the array substrate. The array substrate is a silicon-based organic light-emitting diode array substrate, and the cover plate comprises a plurality of edges. At positions of at least two edges of the cover plate, an orthographic projection of the array substrate in a plane parallel to the array substrate extends outside an orthographic projection of the cover plate in the plane. The relationship between the orthographic projection of the array substrate and the orthographic projection of the cover plate can be explained as follows. The orthographic projection of the array substrate in the plane parallel to the array substrate covers the orthographic projection of the cover plate in the plane. The orthographic projection of the array substrate comprises a plurality of edges, and the orthographic projection of the cover plate comprises a plurality of edges. The plurality of edges of the orthographic projection of the array substrate are in one-to-one correspondence to the plurality of edges of the orthographic projection of the cover plate. At least two edges of the orthographic projection of the array substrate do not overlap with corresponding edges of the orthographic projection of the cover plate and are located outside the orthographic projection of the cover plate.

Figure 1B:
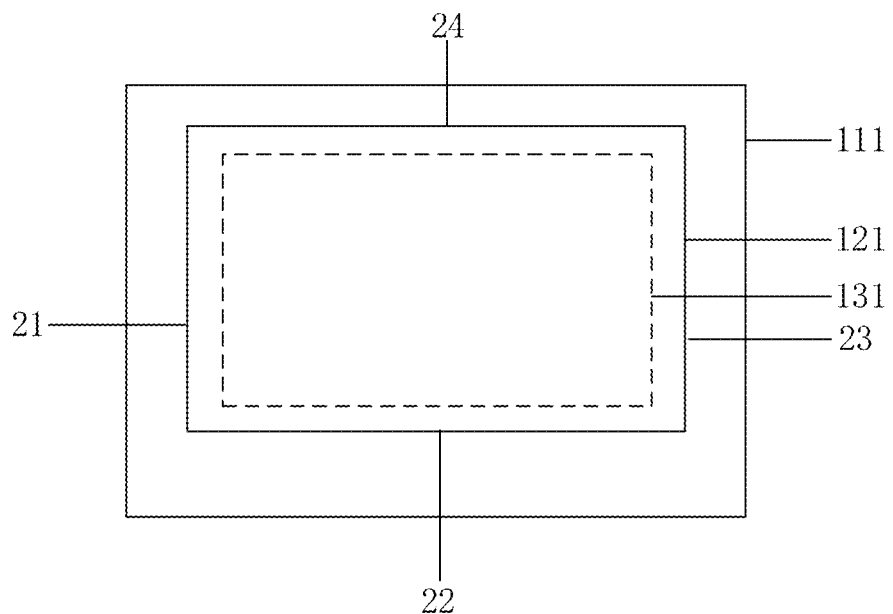
FIG. 1B is a schematic projection diagram of the display device illustrated in FIG. 1A.

FIG. 1A is a schematic diagram of a display device provided by some embodiments of the present disclosure, and FIG. 1B is a schematic projection diagram of the display device illustrated in FIG. 1A. As illustrated in FIG. 1A and FIG. 1B, a display device 100 includes an array substrate 110 and a cover plate 120 which is opposite to the array substrate 110.

For example, the array substrate 110 is a silicon-based organic light-emitting diode array substrate (a silicon-based OLED array substrate) and can be used for display. The array substrate 110 includes, for example, a silicon substrate. For example, the array substrate 110 may also include any suitable components, such as organic light-emitting materials disposed on the silicon substrate, so as to realize a display function, and the embodiments of the present disclosure are not limited thereto. For example, the silicon substrate may include any suitable components, such as a gate driving circuit, a data driving circuit, a pixel circuit, etc., which are integrated in the silicon substrate, and the embodiments of the present disclosure are not limited thereto.

The cover plate 120 is disposed opposite to the array substrate 110. For example, the cover plate 120 is bonded to the array substrate 110 to play a role of protection and improving the strength. For example, the cover plate 120 and the array substrate 110 are parallel to each other. For example, a material of the cover plate 120 is a transparent material, such as glass, that is, the cover plate 120 may be a glass cover plate. For example, in some examples, the cover plate 120 may be made of plain glass with high transmittance. For example, the cover plate 120 includes a plurality of edges. For example, in some examples, as illustrated in FIG. 1A, the cover plate 120 is rectangular and thus includes four edges, namely, a first edge 21 of the cover plate 120, a second edge 22 of the cover plate 120, a third edge 23 of the cover plate 120, and a fourth edge 24 of the cover plate 120.

For example, as illustrated in FIG. 1B, at positions of at least two edges of the cover plate 120 (the case of at four edges 21-24 is illustrated in the figure), an orthographic projection 111 of the array substrate 110 in a plane parallel to the array substrate 110 extends outside an orthographic projection 121 of the cover plate 120 in the plane. That is, at the positions of at least two edges of the cover plate 120, an area covered by the orthographic projection 111 of the array substrate 110 is larger than an area covered by the orthographic projection 121 of the cover plate 120, and the orthographic projection 121 of the cover plate 120 is located within the orthographic projection 111 of the array substrate 110. In other words, the orthographic projection 111 of the array substrate 110 in the plane parallel to the array substrate 110 covers the orthographic projection 121 of the cover plate 120 in the plane, and at least two edges of the orthographic projection 111 of the array substrate 110 do not overlap with corresponding edges of the orthographic projection 121 of the cover plate 120 and are located outside the orthographic projection 121 of the cover plate 120. It should be noted that the orthographic projection 111 of the array substrate 110 comprises a plurality of edges, and the plurality of edges correspond to the edges (e.g., edges 11-14 described below) of the array substrate 110, respectively; and the orthographic projection 121 of the cover plate 120 comprises a plurality of edges, and the plurality of edges correspond to the edges (e.g., edges 21-24) of the cover plate 120, respectively. The plurality of edges of the orthographic projection 111 of the array substrate 110 are in one-to-one correspondence to the plurality of edges of the orthographic projection 121 of the cover plate 120. Referring to FIG. 1A and FIG. 1B, the size of the cover plate 120 is less than the size of the array substrate 110. At the positions of at least two edges of the cover plate 120, the cover plate 120 and the array substrate 110 are designed with uneven edges, that is, the edges of the cover plate 120 are not aligned with the edges of the array substrate 110. For example, at the positions of at least two edges of the cover plate 120, there is a region, which is not covered by the cover plate 120, of the array substrate 110, and in the example illustrated in FIGS. 1A and 1B, the region, which is not covered by the cover plate 120, of the array substrate 110 is a rectangular ring.

Here, "orthographic projection" refers to a projection of the array substrate 110 in the plane parallel to the array substrate 110 in a direction perpendicular to the array substrate 110, or refers to a projection of the cover plate 120 in the plane parallel to the array substrate 110 in the direction perpendicular to the array substrate 110.

In the above manner, in the case where the display device 100 is positioned, fixed, and locked (for example, in the case where the display device 100 is fixed in AR/VR equipment), a fixture for positioning, fixing and locking is only in contact with the array substrate 110 (for example, in contact with the region, that is not covered by the cover plate 120, at the edge of the array substrate 110) and is not in contact with the cover plate 120, thereby lowering the risk of breakage of the cover plate 120 and facilitating positioning, fixing and locking.

In the manufacturing process, when cutting the array substrate motherboard, only the array substrate 110 needs to be cut (e.g., the region, that is not covered by the cover plate 120, at the edge of the array substrate 110 needs to be cut), and the cover plate 120 is not cut, thereby preventing the cover plate 120 from being cut twice, avoiding damaging the cutting machine, and solving the problems of uneven edge, edge collapse, etc., of the cover plate 120. For example, in some examples, the array substrate motherboard is bonded to a plurality of cover plates 120 and then is cut. The plurality of cover plates 120 refer to a plurality of separated parts, corresponding to a plurality of array substrate regions on the array substrate motherboard, obtained by cutting a cover plate motherboard before cutting the array substrate motherboard, and the obtained plurality of cover plates 120 are bonded to the plurality of array substrate regions on the array substrate motherboard correspondingly. For example, in some other examples, the array substrate motherboard is bonded to the cover plate motherboard, and the array substrate motherboard is cut after the cover plate motherboard is cut. When cutting the cover plate motherboard, the cover plate motherboard is cut into cover plates 120 corresponding to the plurality of array substrate regions on the array substrate motherboard by controlling parameters, such as cutting depth, thereby advoiding damaging the array substrate motherboard, and the array substrate motherboard is cut after the cutting of the cover plate motherboard is completed.

The display device 100 helps to improve the bonding accuracy and connection strength of the cover plate 120, improve the bonding effect, improve the bonding efficiency and product yield, improve the capability of matching other structures and the mechanical strength, and prolong the service life.

For example, in some examples, as illustrated in FIG. 1A, the array substrate 110 includes a plurality of edges, namely, a first edge 11 of the array substrate 110, a second edge 12 of the array substrate 110, a third edge 13 of the array substrate 110, and a fourth edge 14 of the array substrate 110. For example, the plurality of edges 21-24 of the cover plate 120 are in one-to-one correspondence to the plurality of edges 11-14 of the array substrate 110, and the edges 21-24 of the cover plate 120 are parallel to the corresponding edges 11-14 of the array substrate 110, respectively. For example, the first edge 21 of the cover plate 120 corresponds to and is parallel to the first edge 11 of the array substrate 110, the second edge 22 of the cover plate 120 corresponds to and is parallel to the second edge 12 of the array substrate 110, the third edge 23 of the cover plate 120 corresponds to and is parallel to the third edge 13 of the array substrate 110, and the fourth edge 24 of the cover plate 120 corresponds to and is parallel to the fourth edge 14 of the array substrate 110. That is, a shape of the array substrate 110 and a shape of the cover plate 120 are the same or almost the same, for example, both are rectangles, both are squares, both are hexagons, etc. Of course, the embodiments of the present disclosure are not limited to this case, and the shape of the array substrate 110 and the shape of the cover plate 120 may be different, which may be determined according to actual requirements. Here, "the shapes are the same or almost the same" means that both are the same type of shape, but it does not mean that proportions of the corresponding edges of both are the same. For example, in the case where both are rectangles, respective aspect ratios may be the same or different, and the embodiments of the present disclosure are not limited thereto.

For example, in some examples, among the edges of the cover plate 120 and the array substrate 110 that are corresponding to each other and not equal in length, a difference in length between at least one edge of the cover plate 120 and a corresponding edge of the array substrate 110 ranges from about −3 mm to −0.5 mm, for example, is about −1.2 mm. For example, a difference between the first edge 21 of the cover plate 120 and the first edge 11 of the array substrate 110 ranges from about −3 mm to −0.5 mm, and/or a difference between the second edge 22 of the cover plate 120 and the second edge 12 of the array substrate 110 ranges from about −3 mm to −0.5 mm, and so on. It should be noted that the above-mentioned difference range is only exemplary, and the specific numerical range can be determined according to actual requirements. For example, any one or more endpoint values of the above-mentioned exemplary numerical range can be adjusted within a range of −5% to +5%, and the embodiments of the present disclosure are not limited to this case.

For example, as illustrated in FIG. 1A, the display device 100 further includes a display region 130. The display region 130 includes a plurality of pixel units and is used for display, and the display region 130 is, for example, an active region (AA). For example, the display region 130 is provided with pixel circuits, organic light-emitting materials, and the like, so as to display under drive of scanning signals and data signals. For example, as illustrated in FIG. 1B, an orthographic projection 131 of the display region 130 in the above-mentioned plane (the plane parallel to the array substrate 110) is located within the orthographic projection 121 of the cover plate 120 in the above-mentioned plane. That is, the cover plate 120 completely covers the display region 130, so that moisture-resistant and oxygen-resistant functions can be provided better to improve the display quality, the device aging can be prevented, and the service life can be prolonged.

For example, the display region 130 includes a plurality of edges. For example, in some examples, the display region 130 is a rectangle and thus includes four edges, namely, a first edge 31 of the display region 130, a second edge 32 of the display region 130, a third edge 33 of the display region 130, and a fourth edge 34 of the display region 130. For example, the plurality of edges 31-34 of the display region 130 are in one-to-one correspondence to the plurality of edges 21-24 of the cover plate 120, and the edges of the cover plate 120 are parallel to the edges, which are corresponding to the edges of the cover plate 120, of the display region 130, respectively. For example, the first edge 31 of the display region 130 corresponds to and is parallel to the first edge 21 of the cover plate 120, the second edge 32 of the display region 130 corresponds to and is parallel to the second edge 22 of the cover plate 120, the third edge 33 of the display region 130 corresponds to and is parallel to the third edge 23 of the cover plate 120, and the fourth edge 34 of the display region 130 corresponds to and is parallel to the fourth edge 24 of the cover plate 120. That is, a shape of the display region 130 and the shape of the cover plate 120 are the same or almost the same, for example, both are rectangles, both are squares, both are hexagons, etc. Of course, the embodiments of the present disclosure are not limited to this case, and the shape of the display region 130 and the shape of the cover plate 120 may be different, which may be determined according to actual requirements. Here, "the shapes are same or almost the same" means that both are the same type of shape, but it does not mean that the proportions of the corresponding edges of both are the same. For example, in the case where both are rectangles, respective aspect ratios may be the same or different, and the embodiments of the present disclosure are not limited thereto.

For example, in some examples, among the edges of the display region 130 and the cover plate 120 that are corresponding to each other and not equal in length, a difference in length between at least one edge of the display region 130 and the corresponding edge of the cover plate 120 ranges from about −2 mm to −0.1 mm, for example, is about −0.5 mm. For example, a difference in length between the first edge 31 of the display region 130 and the first edge 21 of the cover plate 120 ranges from about −2 mm to −0.1 mm, and/or a difference in length between the second edge 32 of the display region 130 and the second edge 22 of the cover plate 120 ranges from about −2 mm to −0.1 mm, and so on. It should be noted that the above-mentioned difference range is only exemplary, and the specific numerical range can be determined according to actual requirements. For example, any one or more endpoint values of the above-mentioned exemplary numerical range can be adjusted within the range of −5% to +5%, and the embodiments of the present disclosure are not limited to this case.

It should be noted that in the example illustrated in FIG. 1A and FIG. 1B, the cover plate 120 includes four edges 21-24. At positions of the four edges 21-24 of the cover plate 120, the orthographic projection 111 of the array substrate 110 in the above-mentioned plane extends outside the orthographic projection 121 of the cover plate 120 in the above-mentioned plane (that is, four edges of the orthographic projection 111 of the array substrate 110 do not overlap with corresponding edges of the orthographic projection 121 of the cover plate 120 and are all located outside the orthographic projection 121 of the cover plate 120), so that any edge of the cover plate 120 can be prevented from being cut twice and is not affected by external force during positioning, fixing and locking. Of course, the embodiments of the present disclosure include, but are not limited to this case. In some other examples, the orthographic projection 111 of the array substrate 110 in the above-mentioned plane may extend outside the orthographic projection 121 of the cover plate 120 in the above-mentioned plane only at positions of two edges or three edges of the cover plate 120. In the case where there are more than four edges of the cover plate 120, the orthographic projection 111 of the array substrate 110 in the above-mentioned plane may also extend outside the orthographic projection 121 of the cover plate 120 in the above-mentioned plane at positions of five edges, six edges or other number of edges of the cover plate 120.

Figure 2A:
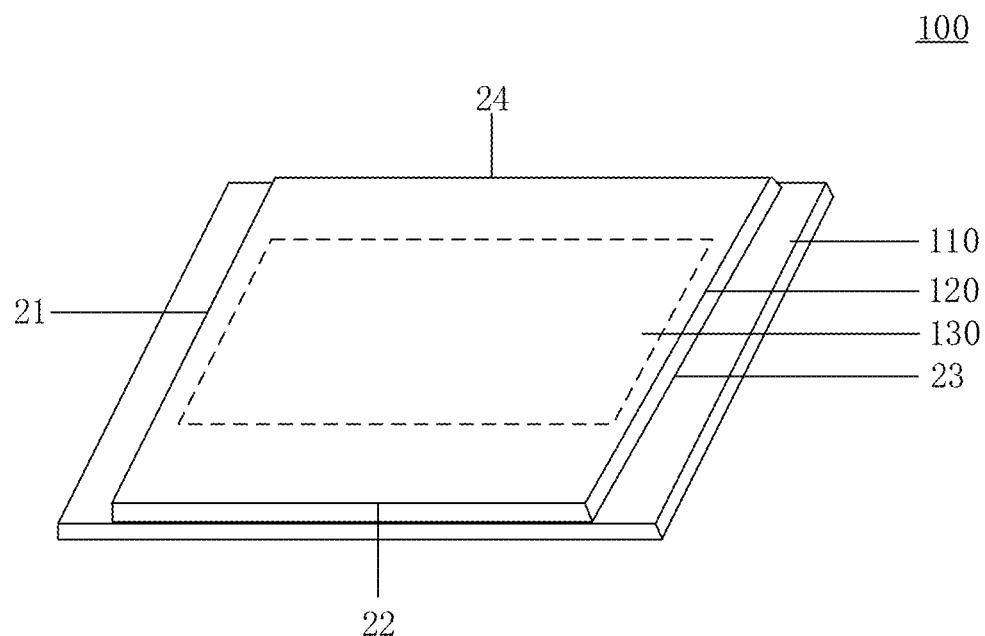
FIG. 2A is a schematic diagram of another display device provided by some embodiments of the present disclosure.
Figure 2B:
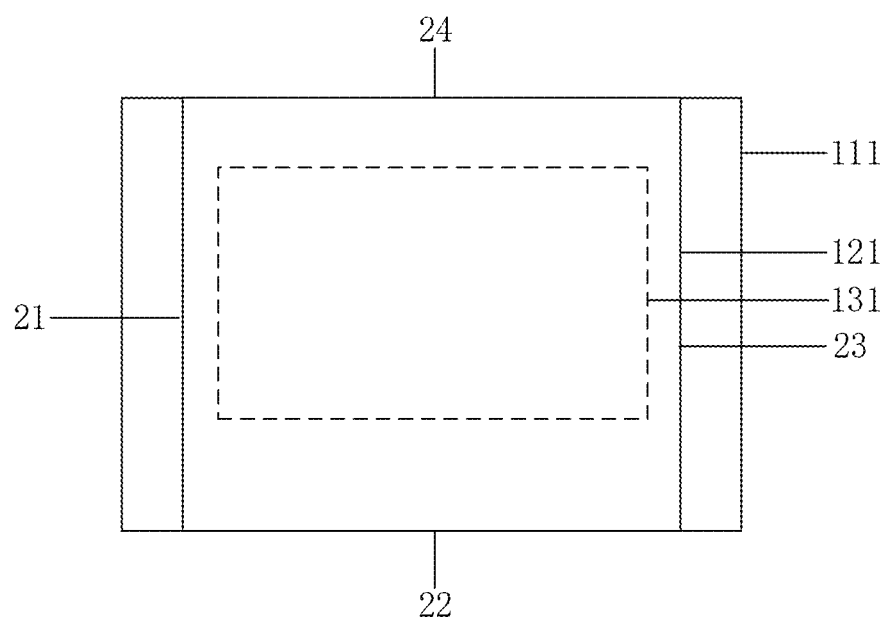

For example, in some examples, as illustrated in FIG. 2A and FIG. 2B, at positions of the first edge 21 of the cover plate 120 and the third edge 23 of the cover plate 120, the orthographic projection 111 of the array substrate 110 in the above-mentioned plane extends outside the orthographic projection 121 of the cover plate 120 in the above-mentioned plane, while at positions of the second edge 22 of the cover plate 120 and the fourth edge 24 of the cover plate 120, the orthographic projection 111 of the array substrate 110 in the above-mentioned plane overlaps with the orthographic projection 121 of the cover plate 120 in the above-mentioned plane. That is, at the positions of the first edge 21 of the cover plate 120 and the third edge 23 of the cover plate 120, the cover plate 120 and the array substrate 110 are designed to be not aligned with each other, while at the positions of the second edge 22 and the fourth edge 24 of the cover plate 120, the cover plate 120 and the array substrate 110 are designed to be aligned with each other.

Figure 3A:
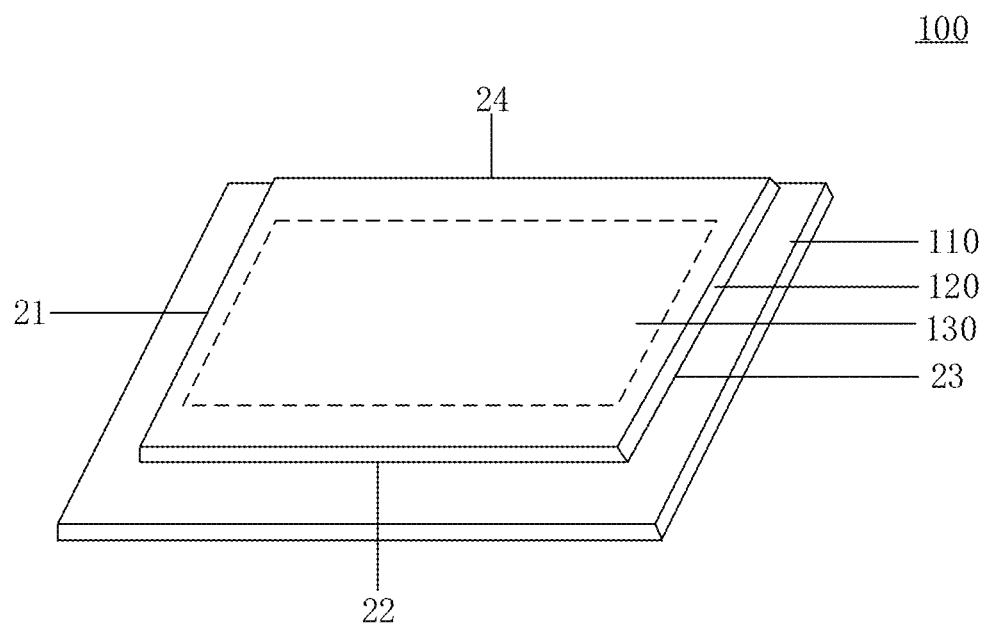
FIG. 3A is a schematic diagram of another display device provided by some embodiments of the present disclosure.
Figure 3B:
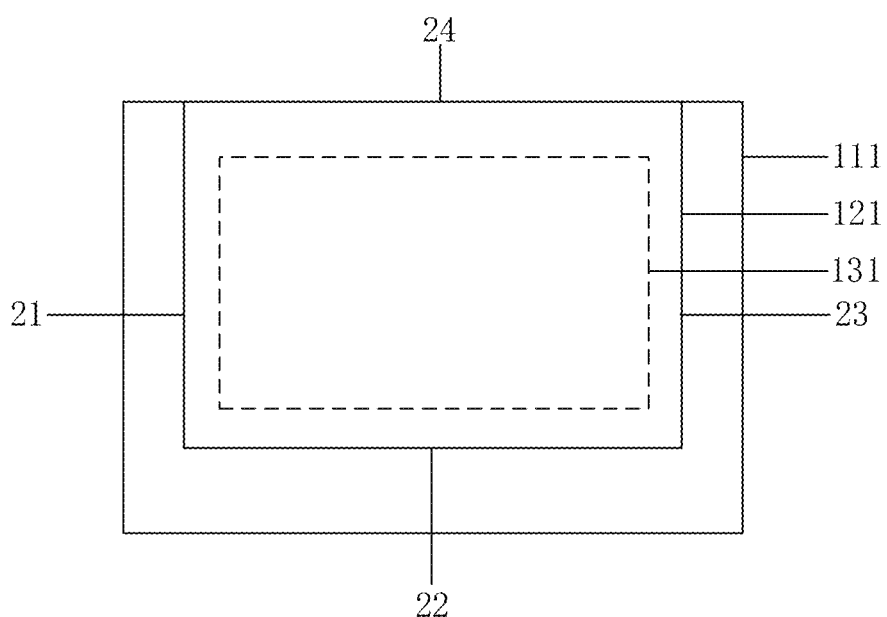
FIG. 3B is a schematic projection diagram of the display device illustrated in FIG. 3A.

For example, in some examples, as illustrated in FIGS. 3A and 3B, at the positions of the first edge 21, the second edge 22, and the third edge 23 of the cover plate 120, the orthographic projection 111 of the array substrate 110 in the above-mentioned plane extends outside the orthographic projection 121 of the cover plate 120 in the above-mentioned plane, while at the position of the fourth edge 24 of the cover plate 120, the orthographic projection 111 of the array substrate 110 in the above-mentioned plane overlaps with the orthographic projection 121 of the cover plate 120 in the above-mentioned plane. That is, at the positions of the first edge 21, the second edge 22, and the third edge 23 of the cover plate 120, the cover plate 120 and the array substrate 110 are designed to be not aligned with each other, while at the position of the fourth edge 24 of the cover plate 120, the cover plate 120 and the array substrate 110 are designed to be aligned with each other.

Figure 4A:
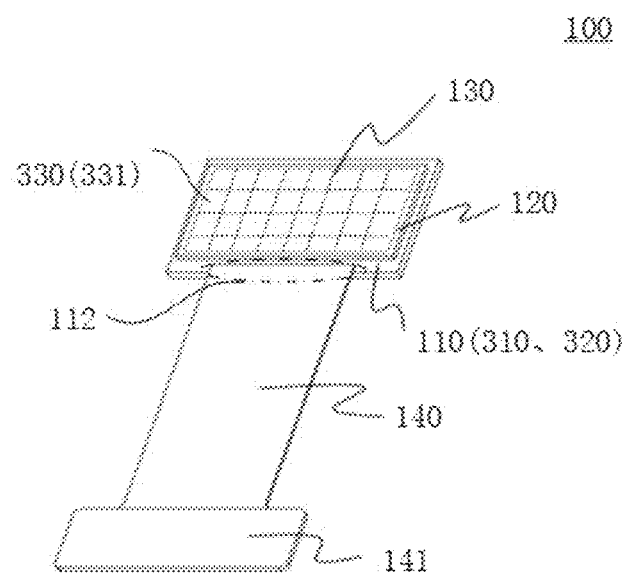
FIG. 4A is a schematic diagram of another display device provided by some embodiments of the present disclosure.
Figure 4B:
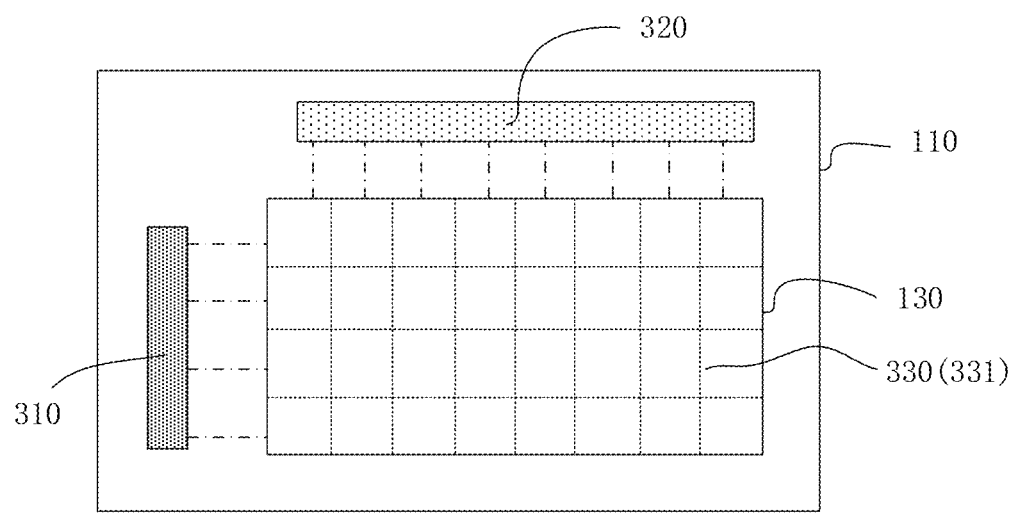
FIG. 4B is a schematic plane diagram of an array substrate of the display device illustrated in FIG. 4A.

FIG. 4A is a schematic diagram of another display device provided by some embodiments of the present disclosure, and FIG. 4B is a schematic plane diagram of an array substrate of the display device illustrated in FIG. 4A. As illustrated in FIG. 4A, the display device 100 further includes a flexible printed circuit (FPC) board 140. For example, the array substrate 110 includes a first bonding region 112, and an orthographic projection of the first bonding region 112 in the plane parallel to the array substrate 110 does not overlap with the orthographic projection of the cover plate 120 in the plane, that is, the first bonding region 112 is not covered by the cover plate 120. For example, as illustrated in FIG. 4B, the array substrate 110 includes a gate driving circuit 310, a data driving circuit 320, and a plurality of pixel units 330, each of the plurality of pixel units 330 includes a cathode 331. For example, in some examples, cathodes 331 of the plurality of pixel units 330 are integrally formed to constitute a common cathode structure. The gate driving circuit 310 is configured to provide gate scanning signals to the plurality of pixel units 330, and the data driving circuit 320 is configured to provide data signals to the plurality of pixel units 330. For example, the flexible printed circuit board 140 is electrically connected to the first bonding region 112, and is configured to transmit electrical signals to the gate driving circuit 310, the data driving circuit 320, and the cathodes 331 of the pixel units 330, respectively, so as to realize transmission of external signals, thereby driving the pixel units 330 on the array substrate 110 to display. For example, the flexible printed circuit board 140 further includes a connection structure 141 to facilitate electrical connection with other devices (e.g., control circuits, central controllers, etc.).

Figure 5:
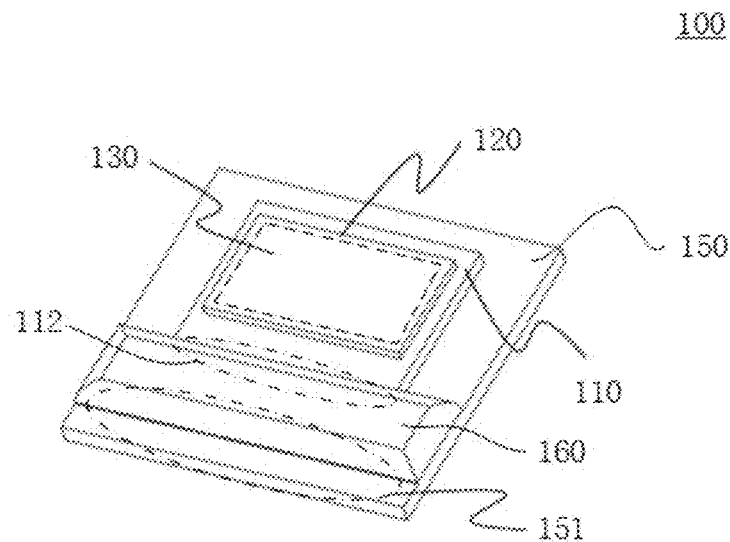
FIG. 5 is a schematic diagram of another display device provided by some embodiments of the present disclosure.

FIG. 5 is a schematic diagram of another display device provided by some embodiments of the present disclosure. As illustrated in FIG. 5, the display device 100 further includes a hard printed circuit board (PCB) 150. For example, the array substrate 110 is disposed on the hard printed circuit board 150, which provides functions such as supporting, fixing, etc. For example, the hard printed circuit board 150 includes a second bonding region 151, and an orthographic projection of the second bonding region 151 in the plane parallel to the array substrate 110 does not overlap with the array substrate 110. The first bonding region 112 of the array substrate 110 is electrically connected to the second bonding region 151 of the hard printed circuit board 150 through a conductive member 160, so as to realize the transmission of external signals, thereby driving the pixel units on the array substrate 110 to display. For example, the hard printed circuit board 150 is also provided with a control circuit, a central controller, an interface, etc., so as to provide corresponding signals for the pixel units on the array substrate 110. For example, the conductive member 160 may be any suitable member, such as a connector, conductive adhesive, etc., as long as the electrical connection between the first bonding region 112 and the second bonding region 151 can be realized, and the embodiments of the present disclosure are not limited to this case.

Figure 6A:
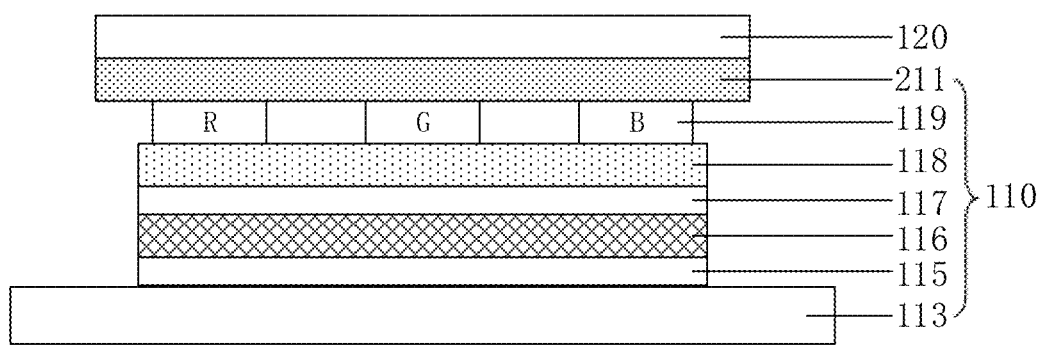
FIG. 6A is a schematic diagram of a layer structure of a display device provided by some embodiments of the present disclosure.

FIG. 6A is a schematic diagram of a layer structure of a display device provided by some embodiments of the present disclosure. As illustrated in FIG. 6A, the array substrate 110 includes a silicon substrate 113, and an anode layer 115, an organic light-emitting layer 116, a cathode layer 117, a first thin film encapsulation layer 118, a color film layer 119, and a second thin film encapsulation layer 211, which are sequentially laminated on the silicon substrate 113.

For example, the silicon substrate 113 provides functions such as supporting, protection, etc. The silicon substrate 113 includes pixel circuits for driving respective pixel units (the detailed structure of the silicon substrate 113 is not illustrated in FIG. 6A). The pixel circuit may be a common 2T1C pixel circuit or a common 4T1C pixel circuit, or a pixel circuit having functions of internal compensation, external compensation, and the like, and the embodiments of the present disclosure are not limited to this case. The pixel circuit is manufactured in the silicon substrate 113 by using, for example, a CMOS process.

The anode layer 115 is disposed on the silicon substrate 113, and for example, is made of a transparent conductive material, such as indium tin oxide (ITO), so as to possess higher transmittance, higher power function, etc. The organic light-emitting layer 116 is disposed on the anode layer 115 and may be a single-layer or multi-layer structure. For example, in some examples, the organic light-emitting layer 116 may be a multi-layer structure including a plurality of film layers, such as a hole injection layer, an electron injection layer, a hole transport layer, an electron transport layer, an electron blocking layer, a hole blocking layer, a light-emitting layer, and the like. The cathode layer 117 is disposed on the organic light-emitting layer 116, and may be manufactured of, for example, metals, such as magnesium, silver, or alloy materials thereof, or transparent conductive materials. Under the voltage drive of the anode layer 115 and the cathode layer 117, the organic light-emitting layer 116 emits light according to a desired gray scale by using the light-emitting characteristics of the organic material.

The first thin film encapsulation layer 118 is disposed on the cathode layer 117. The color film layer 119 is disposed on the first thin film encapsulation layer 118, and for example, includes pixel regions including colors of red (R), green (G), blue (B), and the like. Of course, the embodiments of the present disclosure are not limited to this case, and the color film layer 119 may also include pixel regions of other colors, such as white, yellow, and the like. The second thin film encapsulation layer 211 is disposed on the color film layer 119 to protect the color film layer 119. The cover plate 120 is disposed on the second thin film encapsulation layer 211. For example, the first thin film encapsulation layer 118 and the second thin film encapsulation layer 211 are formed by combining one or more of organic materials and inorganic materials with better sealing characteristics, thereby protecting the OLED device structure and achieving better sealing effect.

Figure 6B:
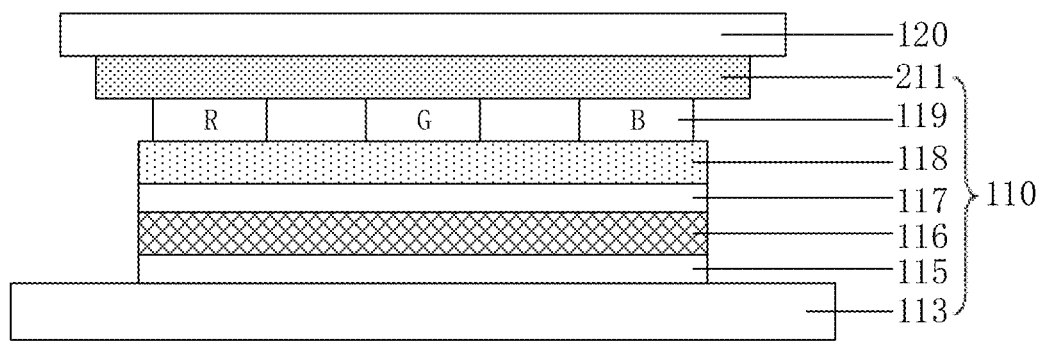
FIG. 6B is a schematic diagram of a layer structure of another display device provided by some embodiments of the present disclosure.

For example, an orthographic projection of the anode layer 115, an orthographic projection of the organic light-emitting layer 116, an orthographic projection of the cathode layer 117, an orthographic projection of the first thin film encapsulation layer 118, and an orthographic projection of the color film layer 119 in the plane parallel to the array substrate 110 are all located within the orthographic projection of the cover plate 120 in this plane. For example, the anode layer 115, the organic light-emitting layer 116, the cathode layer 117, the first thin film encapsulation layer 118, and the color film layer 119 are at least located in the display region 130, that is, the display region 130 can display through the cooperation of the above-mentioned respective film layers. For example, in some examples, as illustrated in FIG. 6A, an orthographic projection of the second thin film encapsulation layer 211 in the plane parallel to the array substrate 110 overlaps with the orthographic projection of the cover plate 120 in the plane, that is, the size of the second thin film encapsulation layer 211 is identical to the size of the cover plate 120, and the second thin film encapsulation layer 211 is completely covered by the cover plate 120, thereby providing better moisture-resistant and oxygen-resistant functions. Of course, the embodiments of the present disclosure are not limited to this case. In some other examples, as illustrated in FIG. 6B, the orthographic projection of the second thin film encapsulation layer 211 in the plane parallel to the array substrate 110 may also be within the orthographic projection of the cover plate 120 in this plane, that is, the size of the cover plate 120 is larger than the size of the second thin film encapsulation layer 211, thereby lowering the requirement on the process accuracy.

For example, an area of the silicon substrate 113 is S1, an area of the multi-layer structure including the anode layer 115, the organic light-emitting layer 116, the cathode layer 117, the first thin film encapsulation layer 118, and the color film layer 119 is S2, and an area of the cover plate 120 is S3, S1>S3>S2.

Figure 7:
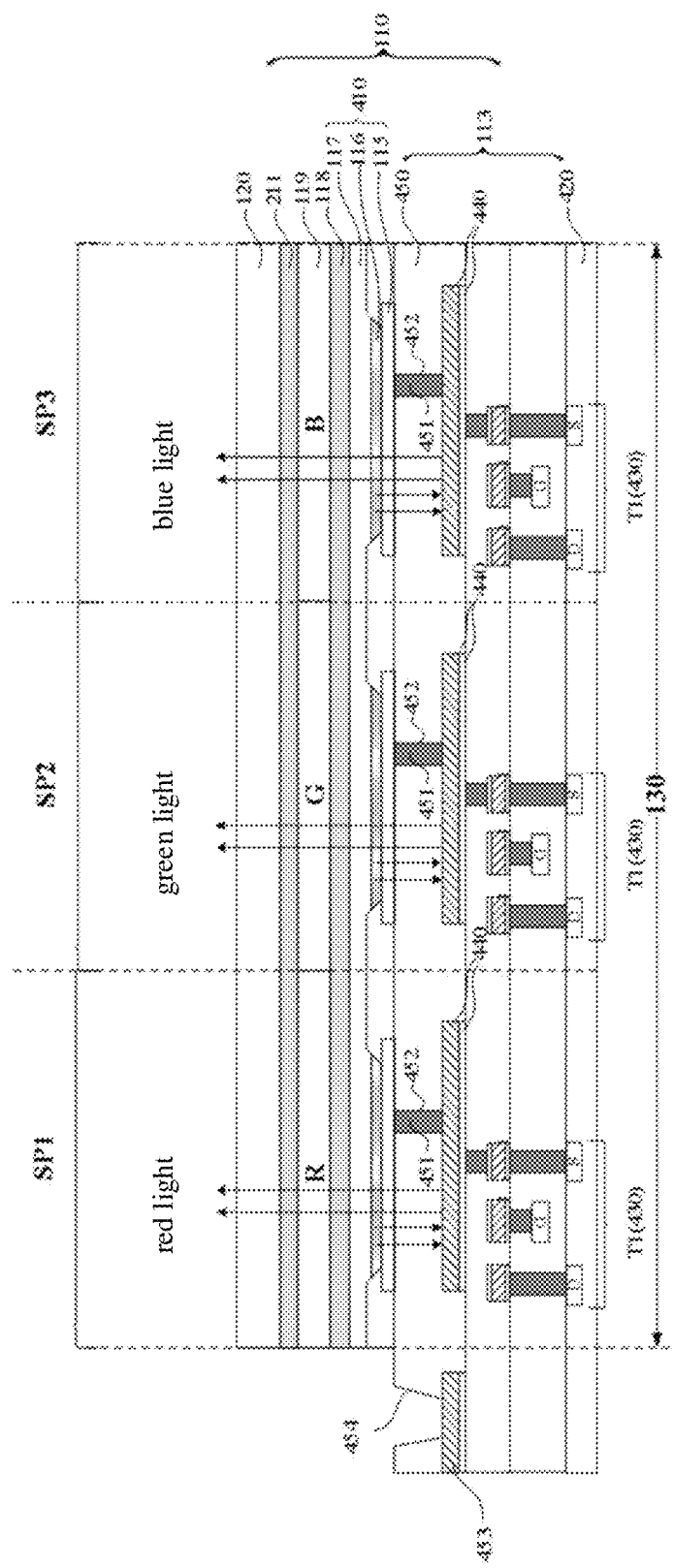
FIG. 7 is a partial cross-sectional schematic diagram of a display device provided by some embodiments of the present disclosure.

FIG. 7 is a partial cross-sectional schematic diagram of a display device provided by some embodiments of the present disclosure. The display device of this embodiment is basically identical to the display device illustrated in FIG. 6A or FIG. 6B, except that the structure of the array substrate 110 is illustrated in more detail and a plurality of sub-pixels are illustrated. It should be understood that the array substrate 110 in this embodiment may be completely identical or substantially identical to the array substrate 110 in the display device illustrated in FIG. 6A or FIG. 6B, and the detailed structure of the array substrate 110 is not illustrated in FIG. 6A or FIG. 6B for simplicity of description. Of course, the array substrate 110 in this embodiment may be different from the array substrate 110 in the display device illustrated in FIG. 6A or FIG. 6B, as long as corresponding functions can be realized. It should be understood that the display device illustrated in FIG. 6A or FIG. 6B also includes a plurality of sub-pixels, and the plurality of sub-pixels are not illustrated in FIG. 6A or FIG. 6B for simplicity of description.

In this embodiment, as illustrated in FIG. 7, the display device includes an array substrate 110, and the array substrate 110 includes a silicon substrate 113 and a light-emitting element 410. For example, the silicon substrate 113 includes a base substrate 420, a pixel circuit 430, a light reflecting layer 440, and an insulating layer 450 that are sequentially laminated. The light-emitting element 410 includes an anode layer 115, an organic light-emitting layer 116, and a cathode layer 117 which are sequentially laminated on the insulating layer 450. The anode layer 115 is a transparent electrode layer. For example, the insulating layer 450 is transparent so that light emitted from the organic light-emitting layer 116 can pass through and reach the light reflecting layer 440 to be reflected by the light reflecting layer 440.

For example, the insulating layer 450 includes a via hole 452 filled with a metal member 451, and the light reflecting layer 440 is electrically connected to the anode layer 115 through the metal member 451. In this way, by forming a conductive channel between the light reflecting layer 440 and the anode layer 115 in the insulating layer 450, it is advantageous to transmit electrical signals provided by the pixel circuit 430 in the silicon substrate 113 to the anode layer 115 through the light reflecting layer 440. In this way, it not only is advantageous to realize the control of the light-emitting element 410 by the pixel circuit 430, but also enables the structure of the display device to be more compact and is advantageous to the miniaturization of the device. Further, for example, the metal member 451 is manufactured of a metal material, such as tungsten metal, and the via hole filled with the tungsten metal is also referred to as a tungsten via hole. For example, in the case where a thickness of the insulating layer 450 is large, forming the tungsten via hole in the insulating layer 450 can ensure the stability of the conductive path. Moreover, due to the mature process of manufacturing the tungsten via hole, the surface flatness of the obtained insulating layer 450 is good, which is conducive to reducing the contact resistance between the insulating layer 450 and the anode layer 115. It can be understood that the tungsten via hole is not only suitable for realizing electrical connection between the insulating layer 450 and the anode layer 115, but also suitable for electrical connection between the light reflecting layer 440 and the pixel circuit 430, as well as electrical connection between other wiring layers.

For example, the silicon substrate 113 includes the pixel circuit 430, the pixel circuit 430 is electrically connected to the light reflecting layer 440, and the pixel circuit 430 is used to drive the light-emitting element 410 to emit light. The pixel circuit 430 includes at least a driving transistor T1 and a switching transistor (not illustrated in the figure), and the driving transistor T1 is electrically connected to the light reflecting layer 440. Thus, the electrical signal for driving the light-emitting element 410 can be transmitted to the anode layer 115 through the light reflecting layer 440, thereby controlling the light-emitting element 410 to emit light. For example, the driving transistor T1 includes a gate electrode G, a source electrode S, and a drain electrode D. The source electrode S of the driving transistor T1 is electrically connected to the light reflecting layer 440. In the case where the driving transistor T1 is in a turn-on state, the electrical signal provided by a power supply line can be transmitted to the anode layer 115 through the source electrode S of the driving transistor T1 and the light reflection layer 440. Because a voltage difference is formed between the anode layer 115 and the cathode layer 117, an electric field is formed between the anode layer 115 and the cathode layer 117, and thus the organic light-emitting layer 116 emits light under the action of the electric field. It can be understood that in the driving transistor T1, the position of the source electrode S and the position of the drain electrode D may be interchangeable, so that one of the source electrode S and the drain electrode D may be electrically connected to the light reflecting layer 440.

For example, the display device includes a plurality of sub-pixels (or pixel units), and three sub-pixels are exemplarily illustrated in FIG. 7, namely, a red sub-pixel SP1, a green sub-pixel SP2, and a blue sub-pixel SP3. Each sub-pixel corresponds to one sub-pixel region of the array substrate 110. That is, an independent light-emitting element 410 and an independent driving transistor T1 are provided in each sub-pixel.

For example, the insulating layer 450 in the three sub-pixels is integrally formed to facilitate manufacture. For example, as illustrated in FIG. 7, the insulating layer 450 further includes an opening 454 for exposing a pad 453, and the arrangement of the opening 454 facilitates electrical connection and signal communication between the pad 453 and external circuits. The colors of sub-pixels in the display device are only schematic and may also include other colors, such as yellow, white, etc.

For example, as illustrated in FIG. 7, the array substrate 110 further includes a first thin film encapsulation layer 118, a color film layer 119, and a second thin film encapsulation layer 211, which are sequentially disposed on the cathode layer 117. The display device further includes a cover plate 120 which is disposed on the second thin film encapsulation layer 211. For example, the first thin film encapsulation layer 118 is located on a side of the cathode layer 117 away from the base substrate 420. The color film layer 119 is located on a side of the first thin film encapsulation layer 118 away from the base substrate 420, and includes a red filter unit R, a green filter unit G, and a blue filter unit B. The second thin film encapsulation layer 211 and the cover plate 120 are located on a side of the color film layer 119 away from the base substrate 420. The specific materials of the first thin film encapsulation layer 118, the color film layer 119, the second thin film encapsulation layer 211, and the cover plate 120 may adopt conventional materials in the art, and are not described in detail here.

For example, in the display device provided by the embodiments of the present disclosure, the light-emitting element 410 including the anode layer 115, the organic light-emitting layer 116, and the cathode layer 117, the first thin film encapsulation layer 118, the color film layer 119, the second thin film encapsulation layer 211, and the cover plate 120 are all manufactured in a panel factory. In addition, the insulating layer 450 above the pad 453 is also etched in the panel factory, thereby exposing the pad 453 and performing a FPC bonding between the pad 453 and a flexible printed circuit board or a wire bonding between the pad 453 and a wire. Therefore, in the embodiments of the present disclosure, the silicon substrate 113 including the light reflecting layer 440 and the insulating layer 450 and suitable for forming the light-emitting element 430 can be manufactured by a wafer fab, which not only lowers the manufacturing difficulty of the light reflecting layer 440, but also facilitates the subsequent process performed by the panel factory.

Figure 8A:
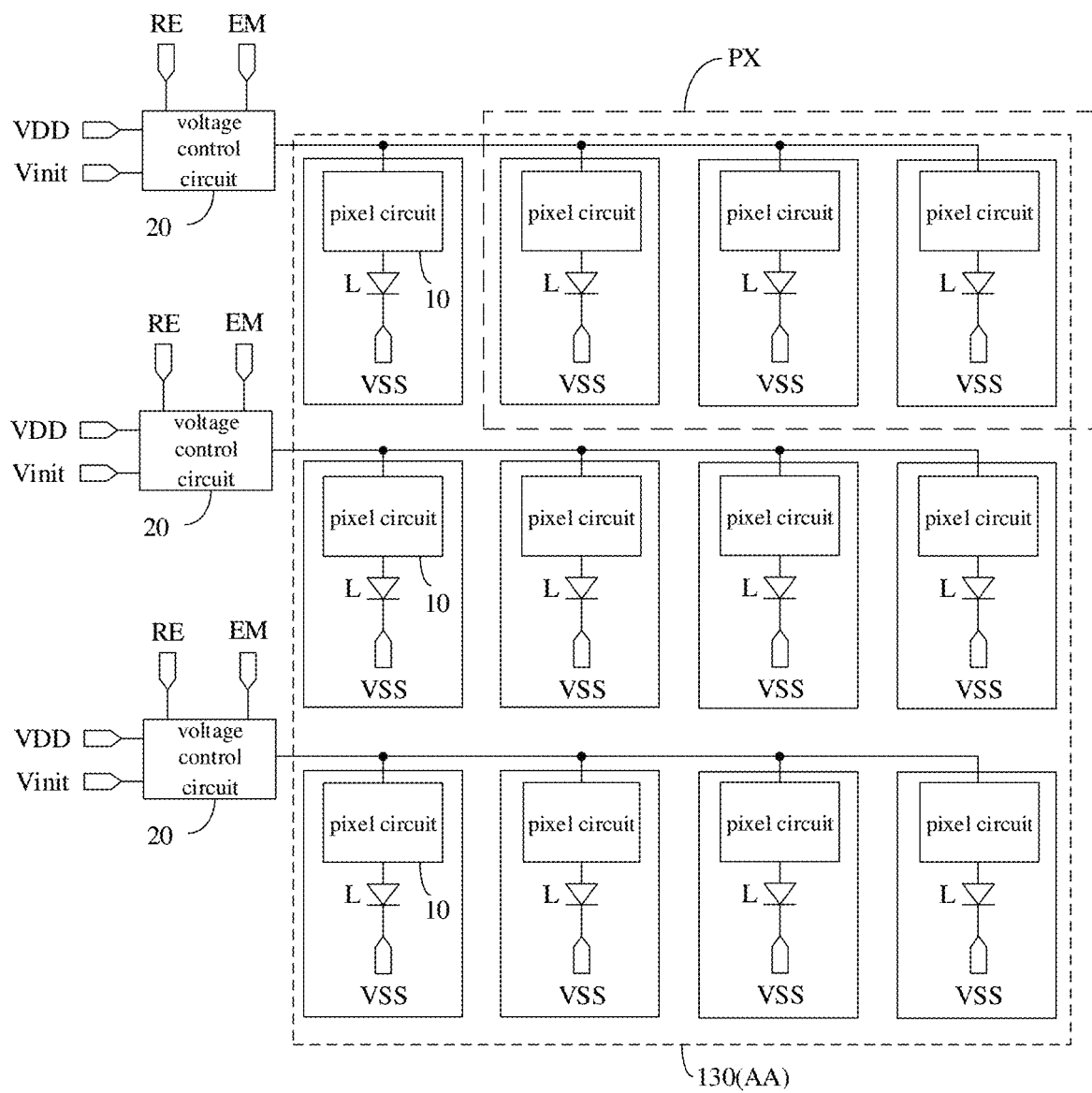
FIG. 8A is a circuit principle schematic diagram of an array substrate of a display device provided by some embodiments of the present disclosure.

FIG. 8A is a circuit principle schematic diagram of an array substrate of a display device provided by some embodiments of the present disclosure. The array substrate includes a plurality of light-emitting elements L located in the display region 130 (AA region) and pixel circuits 10 coupled to respective light-emitting elements L in one-to-one correspondence, and the pixel circuit 10 includes a driving transistor. Moreover, the array substrate may further include a plurality of voltage control circuits 20 located in the non-display regions (regions other than the display region 130) of the array substrate. For example, at least two pixel circuits 10 in a same row share one voltage control circuit 20, and first electrodes of driving transistors in a same row of pixel circuits 10 is coupled to the shared voltage control circuit 20, and second electrodes of respective driving transistors are coupled to corresponding light-emitting elements L. The voltage control circuit 20 is configured to output an initialization signal Vinit to the first electrodes of the driving transistors in response to a reset control signal RE, so as to control the reset of the corresponding light-emitting elements L, and is configured to output a first power supply signal VDD to the first electrodes of the driving transistors in response to a light emission control signal EM, so as to drive the light-emitting elements L to emit light. By sharing the voltage control circuit 20, the structure of respective pixel circuits in the display region 130 can be simplified, and an occupied region of the pixel circuits in the display region 130 can be reduced, so that the display region 130 can be provided with more pixel circuits and light-emitting elements, and an organic light-emitting display panel with high PPI can be realized. In addition, the voltage control circuit 20 outputs the initialization signal Vinit to the first electrodes of the driving transistors under the control of the reset control signal RE to control the reset of the corresponding light-emitting elements, thereby avoiding the influence of the voltage loaded on the light-emitting elements during the light emission of a previous frame on the light emission of a next frame, and further improving the afterimage phenomenon.

For example, the array substrate may further include a plurality of pixel units PX located in the display region 130, and each pixel unit PX includes a plurality of sub-pixels. Each sub-pixel includes one light-emitting element L and one pixel circuit 10, respectively. Further, the pixel unit PX may include 3 sub-pixels of different colors. The three sub-pixels may be a red sub-pixel, a green sub-pixel, and a blue sub-pixel. Of course, the pixel unit PX may also include 4, 5 or more sub-pixels, which needs to be designed and determined according to the actual application environment, and is not limited here.

For example, pixel circuits 10 in at least two adjacent sub-pixels in the same row may share one voltage control circuit 20. For example, in some examples, as illustrated in FIG. 8A, all pixel circuits 10 in the same row may share one voltage control circuit 20. Alternatively, in some other examples, pixel circuits 10 in two, three or more adjacent sub-pixels in the same row may share one voltage control circuit 20, which is not limited here. In this way, the occupied region of the pixel circuits in the display region 130 can be reduced by sharing the voltage control circuit 20.

Figure 8B:
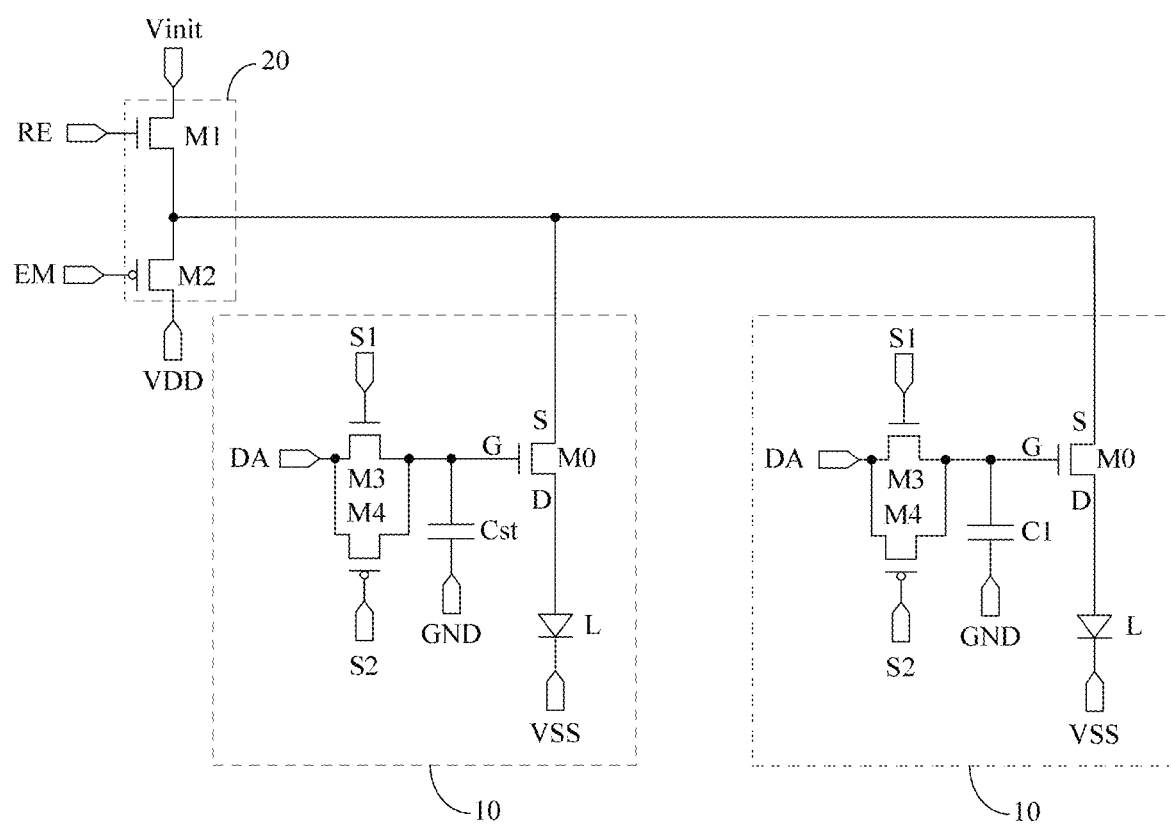
FIG. 8B is a circuit diagram of a specific implementation example of a voltage control circuit and a pixel circuit of a display device provided by some embodiments of the present disclosure.

FIG. 8B is a circuit diagram of a specific implementation example of a voltage control circuit and a pixel circuit of a display device provided by some embodiments of the present disclosure. For example, a driving transistor M0 in the pixel circuit 10 may be an N-type transistor. In the case where a current flows from a first terminal S of the driving transistor M0 to a second terminal D of the driving transistor M0, the first terminal S may serve as a source electrode of the driving transistor M0 and the second terminal D may serve as a drain electrode of the driving transistor M0. In the case where a current flows from the second terminal D to the first terminal S, the second terminal D may serve as the source electrode of the driving transistor M0 and the first terminal S may serve as the drain electrode of the driving transistor M0. Also, the light-emitting element L may include an OLED. Thus, an anode of the OLED is electrically connected to the second terminal D of the driving transistor M0, and a cathode of the OLED is electrically connected to a second power supply terminal VSS. The voltage of the second power supply terminal VSS is generally a negative voltage or a ground voltage VGND (generally 0V), and the voltage of the initialization signal Vinit may also be set to the ground voltage VGND, which is not limited here. For example, the OLED can be set as a Micro-OLED or a Mini-OLED, which is further beneficial to realizing the organic light-emitting display panel with high PPI.

For example, taking two pixel circuits 10 included in a same row as an example, the voltage control circuit 20 may include a first switching transistor M1 and a second switching transistor M2. A gate electrode of the first switching transistor M1 is used for receiving the reset control signal RE, a first electrode of the first switching transistor M1 is used for receiving the initialization signal Vinit, and a second electrode of the first switching transistor M1 is coupled to the first electrode S of the corresponding driving transistor M0. A gate electrode of the second switching transistor M2 is used for receiving the light emission control signal EM, a first electrode of the second switching transistor M2 is used for receiving the first power supply signal VDD, and a second electrode of the second switching transistor M2 is coupled to the first electrode S of the corresponding driving transistor M0.

For example, the type of the first switching transistor M1 and the type of the second switching transistor M2 may be different. For example, the first switching transistor M1 is an N-type transistor and the second switching transistor M2 is a P-type transistor. Alternatively, the first switching transistor M1 is a P-type transistor and the second switching transistor M2 is an N-type transistor. Of course, the first switching transistor M1 and the second switching transistor M2 may be of the same type. In actual application, the types of the first switching transistor M1 and the second switching transistor M2 need to be designed according to the actual application environment, which are not limited here.

For example, the pixel circuit 10 may further include a third switching transistor M3 and a storage capacitor Cst. For example, a gate electrode of the third switching transistor M3 is used to receive a first gate scanning signal S1, a first electrode of the third switching transistor M3 is used to receive a data signal DA, and a second electrode of the third switching transistor M3 is coupled to the gate electrode G of the driving transistor M0. A first terminal of the storage capacitor Cst is coupled to the gate electrode G of the driving transistor M0, and a second terminal of the storage capacitor Cst is coupled to the ground terminal GND.

For example, the pixel circuit 10 may further include a fourth switching transistor M4. For example, a gate electrode of the fourth switching transistor M4 is used to receive a second gate scanning signal S2, a first electrode of the fourth switching transistor M4 is used to receive the data signal DA, and a second electrode of the fourth switching transistor M4 is coupled to the gate electrode G of the driving transistor M0. Furthermore, the fourth switching transistor M4 and the third switching transistor M3 are of different types. For example, the third switching transistor M3 is an N-type transistor and the fourth switching transistor M4 is a P-type transistor. Alternatively, the third switching transistor M3 is a P-type transistor and the fourth switching transistor M4 is an N-type transistor.

It should be noted that in the case where the voltage of the data signal DA is a voltage corresponding to a high gray scale, the fourth switching transistor M4, for example, of the P type, is turned on to transmit the data signal DA to the gate electrode G of the driving transistor M0, so that the voltage of the data signal DA can be prevented from being influenced by a threshold voltage of the third switching transistor M3, for example, of the N type. In the case where the voltage of the data signal DA is a voltage corresponding to a low gray scale, the third switching transistor M3, for example, of the N type, is turned on to transmit the data signal DA to the gate electrode G of the driving transistor M0, so that the voltage of the data signal DA can be prevented from being influenced by a threshold voltage of the fourth switching transistor M4, for example, of the P type. In this way, the voltage range input to the gate electrode G of the driving transistor M0 can be improved.

It should be noted that in the embodiments of the present disclosure, the display device 100 may include more components, but is not limited to the case illustrated in FIGS. 1-8B, which may be determined according to actual requirements, such as functions to be implemented, and the embodiments of the present disclosure are not limited to this case. The display device 100 may also include more or less film layers, but not limited to the case illustrated in FIGS. 6A-7, and the relative positional relationship of the film layers is not limited, which may be determined according to actual requirements, such as design scheme and process conditions.

At least one embodiment of the present disclosure also provides a method for manufacturing a display device, and the display device provided by any embodiment of the present disclosure can be manufactured by using the method. The display device manufactured by using the method can lower the risk of breakage of the glass cover plate, is convenient to positioning, fixing and locking, can prevent the glass cover plate from being cut twice, thereby avoiding damage to the cutting machine, solving the problems of uneven edges, edge collapse, and the like, of the glass cover plate, contributing to improving the bonding precision and the connecting strength of the glass cover plate, improving the bonding effect, improving the capability of matching other structures and the mechanical strength of the display device, and prolonging the service life of the display device.

Figure 9:
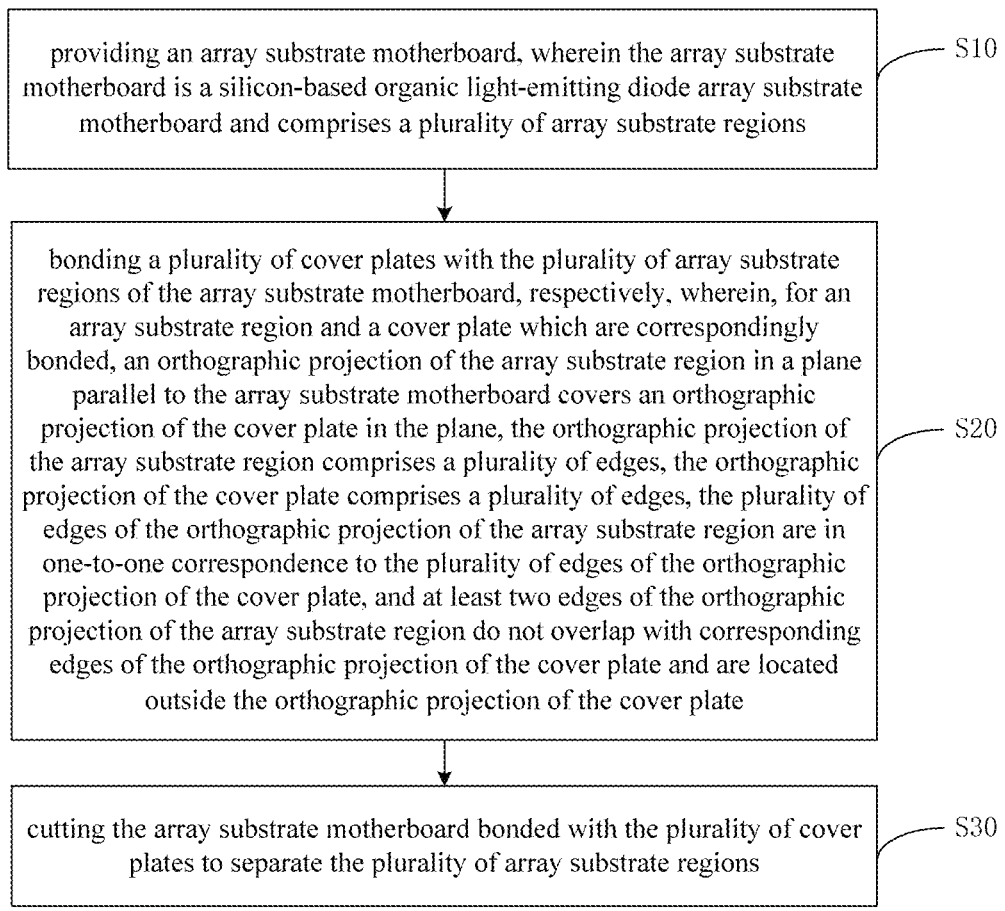
FIG. 9 is a flowchart of a method for manufacturing a display device provided by some embodiments of the present disclosure.

FIG. 9 is a flowchart of a method for manufacturing a display device provided by some embodiments of the present disclosure. For example, in some examples, as illustrated in FIG. 9, the method includes following operations.

Step S10: providing an array substrate motherboard;

step S20: bonding a plurality of cover plates with the plurality of array substrate regions of the array substrate motherboard, respectively; and step S30: cutting the array substrate motherboard bonded with the plurality of cover plates to separate the plurality of array substrate regions.

For example, the array substrate motherboard is a silicon-based organic light-emitting diode array substrate motherboard and includes a plurality of array substrate regions. For example, the aforementioned array substrate 110 can be formed after the array substrate region is cut.

For example, the cover plate includes a plurality of edges. For the array substrate region and the cover plate which are correspondingly bonded, at positions of at least two edges of the cover plate, the orthographic projection of the array substrate region in the plane parallel to the array substrate motherboard extends outside the orthographic projection of the cover plate in the plane. In other words, for the array substrate region and the cover plate which are correspondingly bonded, the orthographic projection of the array substrate region in the plane parallel to the array substrate motherboard covers the orthographic projection of the cover plate in the plane, and at least two edges of the orthographic projection of the array substrate region do not overlap with corresponding edges of the orthographic projection of the cover plate and are located outside the orthographic projection of the cover plate. That is, the relative positional relationship between the cover plate and the array substrate region is the same as the aforementioned relative positional relationship between the cover plate 120 and the array substrate 110.

For example, in some examples, for the array substrate region and the cover plate which are correspondingly bonded, at positions of all edges of the cover plate, the orthographic projection of the array substrate region in the plane parallel to the array substrate motherboard extends outside the orthographic projection of the cover plate in the plane. That is, all edges of the orthographic projection of the array substrate region do not overlap with corresponding edges of the orthographic projection of the cover plate and are located outside the orthographic projection of the cover plate.

For example, an amount of the plurality of cover plates is equal to an amount of the plurality of array substrate regions, and the plurality of cover plates are bonded to the plurality of array substrate regions in a one-to-one correspondence.

When cutting the plurality of array substrate regions of the array substrate motherboard bonded with the plurality of cover plates, because the orthographic projection of the array substrate region extends outside the orthographic projection of the corresponding cover plate, only the array substrate region needs to be cut during cutting, and the cover plate does not need to be cut, so that the cover plate is prevented from being cut twice, the cutting machine is prevented from being damaged, and the problems of uneven edge, edge collapse and the like of the cover plate are solved.

In the case where the display device manufactured by using the method is positioned, fixed and locked, the clamps used for positioning, fixing and locking are only in contact with the array substrate and are not in contact with the cover plate, so that the risk of the cover plate being broken can be lowered, and the positioning, fixing and locking are convenient.

The display device manufactured by using the method contributes to improving the bonding precision and the connecting strength of the cover plate, improving the bonding effect, improving the capability of matching other structures and the mechanical strength, and prolonging the service life.

It should be noted that in the embodiments of the present disclosure, the method is not limited to the steps and sequences described above, but may also include more steps, and the sequences between the various steps may be determined according to actual requirements, and the embodiments of the present disclosure are not limited to this case. The technical effect and detailed description of the method can be referred to the above description of the display device 100 and are not repeated here.

The following statements need to be noted.

(1) The drawings of the embodiments of the present disclosure involve only the structures related to the embodiments of the present disclosure, and other structures may be referred to general design.

(2) In case of no conflict, the embodiments of the present disclosure and the features in the embodiments can be combined with each other to obtain new embodiments.

What have been described above merely are specific implementations of the present disclosure, but the protection scope of the present disclosure is not limited to this. The protection scope of the present disclosure is determined by the appended claims.

What is claimed is:

1. A display device, comprising an array substrate and a cover plate that is opposite to the array substrate,
    wherein the array substrate is a silicon-based organic light-emitting diode array substrate,
    an orthographic projection of the silicon-based organic light-emitting diode array substrate in a plane parallel to the silicon-based organic light-emitting diode array substrate covers an orthographic projection of the cover plate in the plane, the orthographic projection of the silicon-based organic light-emitting diode array substrate comprises a plurality of edges, the orthographic projection of the cover plate comprises a plurality of edges, the plurality of edges of the orthographic projection of the silicon-based organic light-emitting diode array substrate are in one-to-one correspondence to the plurality of edges of the orthographic projection of the cover plate, and
    at least two edges of the orthographic projection of the silicon-based organic light-emitting diode array substrate do not overlap with corresponding edges of the orthographic projection of the cover plate and are located outside the orthographic projection of the cover plate;
    the display device further comprises a printed circuit board, the silicon-based organic light-emitting diode array substrate is disposed on the printed circuit board, and the orthographic projection of the silicon-based organic light-emitting diode array substrate in the plane parallel to the silicon-based organic light-emitting diode array substrate is completely located within an orthographic projection of the printed circuit board in the plane, and the orthographic projection of the printed circuit board in the plane completely covers the orthographic projection of the silicon-based organic light-emitting diode array substrate in the plane.

2. The display device according to claim 1, wherein the orthographic projection of the silicon-based organic light-emitting diode array substrate comprises four edges, the orthographic projection of the cover plate comprises four edges, and the four edges of the orthographic projection of the silicon-based organic light-emitting diode array substrate do not overlap with corresponding edges of the orthographic projection of the cover plate and are all located outside the orthographic projection of the cover plate.

3. The display device according to claim 2, wherein the silicon-based organic light-emitting diode array substrate comprises a plurality of edges, the cover plate comprises a plurality of edges,
    the plurality of edges of the cover plate are in one-to-one correspondence to the plurality of edges of the silicon-based organic light-emitting diode array substrate, and the edges of the cover plate are parallel to the edges, that are corresponding to the edges of the cover plate, of the silicon-based organic light-emitting diode array substrate, respectively.

4. The display device according to claim 1, wherein the silicon-based organic light-emitting diode array substrate comprises a plurality of edges, the cover plate comprises a plurality of edges,
    the plurality of edges of the cover plate are in one-to-one correspondence to the plurality of edges of the silicon-based organic light-emitting diode array substrate, and the edges of the cover plate are parallel to the edges, that are corresponding to the edges of the cover plate, of the silicon-based organic light-emitting diode array substrate, respectively.

5. The display device according to claim 4, wherein a shape of the silicon-based organic light-emitting diode array substrate and a shape of the cover plate are rectangles, squares, or hexagons.

6. The display device according to claim 4, comprising a display region,
    wherein an orthographic projection of the display region in the plane is within the orthographic projection of the cover plate in the plane.

7. The display device according to claim 6, wherein the silicon-based organic light-emitting diode array substrate comprises a silicon substrate and an anode layer, an organic light-emitting layer, a cathode layer, a first thin film encapsulation layer, and a color film layer that are sequentially laminated on the silicon substrate; and
    an orthographic projection of the anode layer, an orthographic projection of the organic light-emitting layer, an orthographic projection of the cathode layer, an orthographic projection of the first thin film encapsulation layer, and an orthographic projection of the color film layer in the plane are all within the orthographic projection of the cover plate in the plane.

8. The display device according to claim 7, wherein the anode layer, the organic light-emitting layer, the cathode layer, the first thin film encapsulation layer, and the color film layer are at least in the display region.

9. The display device according to claim 7, wherein the silicon-based organic light-emitting diode array substrate further comprises a second thin film encapsulation layer,
    the second thin film encapsulation layer is on the color film layer, and the cover plate is on the second thin film encapsulation layer.

10. The display device according to claim 9, wherein an orthographic projection of the second thin film encapsulation layer in the plane is within the orthographic projection of the cover plate in the plane.

11. The display device according to claim 6, wherein the display region comprises a plurality of edges, the plurality of edges of the cover plate are in one-to-one correspondence to the plurality of edges of the display region, and the edges of the cover plate are parallel to the edges, that are corresponding to the edges of the cover plate, of the display region, respectively; and
    among edges of the display region and the cover plate that are corresponding to each other and not equal in length, a difference in length between at least one edge of the display region and a corresponding edge of the cover plate ranges from about −2 mm to −0.1 mm,
about −2 mm to −0.1 mm represents a value of endpoint −2 mm is capable of being adjusted within a range of −5% to +5% and a value of endpoint −0.1 mm is capable of being adjusted within a range of −5% to +5%.

12. The display device according to claim 4, wherein among edges of the cover plate and the silicon-based organic light-emitting diode array substrate that are corresponding to each other and not equal in length, a difference in length between at least one edge of the cover plate and a corresponding edge of the silicon-based organic light-emitting diode array substrate ranges from about −3 mm to −0.5 mm,
about −3 mm to −0.5 mm represents a value of endpoint −3 mm is capable of being adjusted within a range of −5% to +5% and a value of endpoint −0.5 mm is capable of being adjusted within a range of −5% to +5%.

13. The display device according to claim 1, wherein the silicon-based organic light-emitting diode array substrate comprises a first bonding region, and
an orthographic projection of the first bonding region in the plane does not overlap with the orthographic projection of the cover plate in the plane.

14. The display device according to claim 13, further comprising a flexible printed circuit board,
wherein the silicon-based organic light-emitting diode array substrate comprises a gate driving circuit, a data driving circuit, and a plurality of pixel units, and the plurality of pixel units comprise cathodes; and
the flexible printed circuit board is electrically connected to the first bonding region and is configured to transmit electrical signals to the gate driving circuit, the data driving circuit, and the cathodes of the plurality of pixel units, respectively.

15. The display device according to claim 13, wherein the printed circuit board comprises a second bonding region, and an orthographic projection of the second bonding region in the plane parallel to the silicon-based organic light-emitting diode array substrate does not overlap with the silicon-based organic light-emitting diode array substrate; and
the first bonding region is electrically connected to the second bonding region through a conductive member.

16. The display device according to claim 15, wherein a side, adjacent to the silicon-based organic light-emitting diode array substrate, of the conductive member is a first side;
a side, adjacent to the conductive member, of the silicon-based organic light-emitting diode array substrate is a second side;
the first side is parallel to the second side;
the first side and the second side are in contact with each other;
a length of a portion, that is in contact with the first side, of the second side is equal to a side length of the second side; and
a side length of the first side is greater than the side length of the second side.

17. The display device according to claim 1, wherein a material of the cover plate comprises glass.

18. A method for manufacturing a display device, comprising:
providing an array substrate motherboard, wherein the array substrate motherboard is a silicon-based organic light-emitting diode array substrate motherboard and comprises a plurality of silicon-based organic light-emitting diode array substrate regions;
bonding a plurality of cover plates with the plurality of array substrate regions of the silicon-based organic light-emitting diode array substrate motherboard, respectively, wherein, for a silicon-based organic light-emitting diode array substrate region and a cover plate which are correspondingly bonded, an orthographic projection of the silicon-based organic light-emitting diode array substrate region in a plane parallel to the silicon-based organic light-emitting diode array substrate motherboard covers an orthographic projection of the cover plate in the plane, the orthographic projection of the silicon-based organic light-emitting diode array substrate region comprises a plurality of edges, the orthographic projection of the cover plate comprises a plurality of edges, the plurality of edges of the orthographic projection of the silicon-based organic light-emitting diode array substrate region are in one-to-one correspondence to the plurality of edges of the orthographic projection of the cover plate, and at least two edges of the orthographic projection of the silicon-based organic light-emitting diode array substrate region do not overlap with corresponding edges of the orthographic projection of the cover plate and are located outside the orthographic projection of the cover plate; and
cutting the silicon-based organic light-emitting diode array substrate motherboard bonded with the plurality of cover plates to separate the plurality of silicon-based organic light-emitting diode array substrate regions,
wherein the display device comprises a printed circuit board, each silicon-based organic light-emitting diode array substrate region that is separated is disposed on the printed circuit board, and the orthographic projection of the silicon-based organic light-emitting diode array substrate region in the plane parallel to the silicon-based organic light-emitting diode array substrate motherboard is completely located within an orthographic projection of the printed circuit board in the plane, and the orthographic projection of the printed circuit board in the plane completely covers the orthographic projection of the silicon-based organic light-emitting diode array substrate region in the plane.

19. The method according to claim 18, wherein an amount of the plurality of cover plates is equal to an amount of the plurality of silicon-based organic light-emitting diode array substrate regions.

20. The method according to claim 18, wherein, for the silicon-based organic light-emitting diode array substrate region and the cover plate which are correspondingly bonded, all edges of the orthographic projection of the silicon-based organic light-emitting diode array substrate region do not overlap with corresponding edges of the orthographic projection of the cover plate and are located outside the orthographic projection of the cover plate.

* * * * *